United States Patent
Kawaguchi et al.

(10) Patent No.: US 10,141,720 B2
(45) Date of Patent: Nov. 27, 2018

(54) NITRIDE SEMICONDUCTOR LASER ELEMENT

(71) Applicant: Panasonic Corporation, Osaka (JP)

(72) Inventors: Masao Kawaguchi, Osaka (JP); Osamu Imafuji, Osaka (JP); Shinichiro Nozaki, Osaka (JP); Hiroyuki Hagino, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/865,447

(22) Filed: Jan. 9, 2018

(65) Prior Publication Data

US 2018/0131161 A1 May 10, 2018

Related U.S. Application Data

(63) Continuation of application No. PCT/JP2016/003378, filed on Jul. 19, 2016.

(30) Foreign Application Priority Data

Jul. 30, 2015 (JP) .................................. 2015-150198

(51) Int. Cl.
*H01S 5/20* (2006.01)
*H01S 5/343* (2006.01)
(Continued)

(52) U.S. Cl.
CPC ............ *H01S 5/2009* (2013.01); *H01S 5/026* (2013.01); *H01S 5/22* (2013.01); *H01S 5/323* (2013.01);
(Continued)

(58) Field of Classification Search
CPC .... H01S 5/2009; H01S 5/34333; H01S 5/323; H01S 5/22; H01S 5/026; H01S 5/343; H01S 5/02276
See application file for complete search history.

(56) References Cited

U.S. PATENT DOCUMENTS

| | | | |
|---|---|---|---|
| 6,240,114 B1 * | 5/2001 | Anselm ................. | B82Y 20/00 372/45.01 |
| 2004/0184496 A1 * | 9/2004 | Kneissl ................. | B82Y 20/00 372/45.01 |

(Continued)

FOREIGN PATENT DOCUMENTS

| JP | 2010-153430 | 7/2010 |
|---|---|---|
| JP | 2010-272593 | 12/2010 |

(Continued)

OTHER PUBLICATIONS

International Search Report of PCT application No. PCT/JP2016/003378 dated Sep. 13, 2016.
(Continued)

*Primary Examiner* — Dung Nguyen
(74) *Attorney, Agent, or Firm* — McDermott Will & Emery LLP

(57) ABSTRACT

A nitride semiconductor laser element includes an electron barrier layer between a p-side light guide layer and a p-type clad layer. The electron barrier layer has a bandgap energy larger than that of the p-type clad layer. The p-side light guide layer is made of $Al_xGa_{1-x}N$ containing no Indium, where $0 \le x < 1$. A film thickness dn of the n-side light guide layer and a film thickness dp of the p-side light guide layer satisfy relationships $dp \ge 0.25$ μm and $dn \ge dp$.

11 Claims, 7 Drawing Sheets

(51) Int. Cl.
      *H01S 5/026*       (2006.01)
      *H01S 5/22*       (2006.01)
      *H01S 5/323*       (2006.01)
      *H01S 5/022*       (2006.01)

(52) U.S. Cl.
      CPC .......... *H01S 5/343* (2013.01); *H01S 5/34333* (2013.01); *H01S 5/02276* (2013.01)

(56) References Cited

U.S. PATENT DOCUMENTS

| | | |
|---|---|---|
| 2009/0026489 A1 | 1/2009 | Kuramoto |
| 2012/0008657 A1 | 1/2012 | Obata et al. |
| 2012/0273816 A1 | 11/2012 | Yoshida et al. |
| 2015/0295387 A1 | 10/2015 | Obata et al. |

FOREIGN PATENT DOCUMENTS

| | | |
|---|---|---|
| JP | 2011-096870 | 5/2011 |
| JP | 2012-018963 | 1/2012 |
| JP | 2012-209352 | 10/2012 |
| WO | 2006/109418 | 10/2006 |

OTHER PUBLICATIONS

Milind R. Gokhale et al., "High-Power High-Efficiency 0.98-μm Wavelength InGaAs—(In)GaAs(P)—InGaP Broadened Waveguide Lasers Grown by Gas-Source Molecular Beam Epitaxy", IEEE Journal of Quantum Electronics, vol. 33, No. 12, Dec. 1997, pp. 2266-pp. 2276.

\* cited by examiner

NITRIDE SEMICONDUCTOR LASER ELEMENT

RELATED APPLICATIONS

This application is a continuation of the PCT International Application No. PCT/JP2016/003378 filed on Jul. 19, 2016, which claims the benefit of foreign priority of Japanese patent application No. 2015-150198 filed on Jul. 30, 2015, the contents all of which are incorporated herein by reference.

BACKGROUND

1. Technical Field

The present disclosure relates to a nitride semiconductor laser element made of a nitride semiconductor such as GaN.

2. Description of the Related Art

Since semiconductor lasers have excellent features such as a compact size, a low price, and high output, they have been used in a wide range of technical fields including IT technology such as communication and an optical disk, a medical field, and some lighting. In recent years, for use as a light source of a laser display or liquid crystal backlight and high-intensity lighting such as a headlight for vehicles, development has been made particularly for a light source that includes a GaN semiconductor laser and has a wavelength ranging from 405 nm to 540 nm (nitride semiconductor laser element). A semiconductor laser element used as a light source in these devices is required of high output operation for acquisition of a clear image and a clear field of view. Such high output operation consumes more power than low output operation. For reduction of environmental loads, however, it is especially important to reduce power consumption (improve energy efficiency).

The reduction of power consumption and the high output of the semiconductor laser require efficient conversion of supplied power into light. For the efficient conversion, it is important to increase power-to-light conversion efficiency, which indicates a proportion of energy converted into laser light, to energy supplied. This is because efficient conversion of supplied power into light not only can increase optical output but also can prevent excessive energy from turning into heat, reducing a decrease in optical output attributed to heat generation and an adverse effect on characteristics of long term reliability.

For the increase of the power-to-light conversion efficiency, it is necessary to increase slope efficiency of the laser. The slope efficiency is a value obtained by dividing an increased amount of optical output increased along with an increase of current supplied to a semiconductor laser under oscillation operation, by an increased amount of the current supplied. And a unit of the slope efficiency is represented by watt per ampere (W/A). In a GaAs semiconductor laser element, a method for increasing film thickness of a light guide layer is proposed as a structure for increasing the slope efficiency (See IEEE Journal of Quantum Electronics Vol. 33, no. 12, pp. 2266, 1997). This is a technique of decreasing a proportion of guided light distributed in a clad layer, which is large in light absorption, by thickening the light guide layer.

A nitride semiconductor laser element made of a nitride semiconductor such as GaN has a large bandgap. For this reason, an electron barrier layer for preventing leakage of electrons to a p-type layer has been conventionally provided closer to the p-type layer than a light emitting layer. As described in WO 2006/109418 A, a structure for minimizing the leakage of electrons has been a p-side light guide layer having a thickness of about 100 nm and an electron barrier layer provided in such a manner as to be adjacent to an active layer between the active layer and the p-side light guide layer.

SUMMARY

A nitride semiconductor laser element according to the present disclosure includes an n-type clad layer, a p-type clad layer, an active layer, an n-side light guide layer, a p-side light guide layer, and an electron barrier layer. The n-type clad layer and the p-type clad layer are each made of a nitride semiconductor. The active layer is provided between the n-type clad layer and the p-type clad layer. The n-side light guide layer is provided between the n-type clad layer and the active layer and is made of a nitride semiconductor having a bandgap energy smaller than that of the n-type clad layer but larger than that of the active layer. The p-side light guide layer is provided between the p-type clad layer and the active layer and is made of a nitride semiconductor having a bandgap energy smaller than that of the p-type clad layer but larger than that of the active layer. The electron barrier layer is provided between the p-side light guide layer and the p-type clad layer and is made of a nitride semiconductor having a bandgap energy larger than that of the p-type clad layer. The p-side light guide layer is made of $Al_xGa_{1-x}N$ ($0 \leq x < 1$) containing no Indium. A film thickness dn of the n-side light guide layer and a film thickness dp of the p-side light guide layer satisfy relationships $dp \geq 0.25$ μm and $dn \geq dp$.

In the nitride semiconductor laser element having such a configuration, since the electron barrier layer having a large bandgap energy is disposed at a side of the p-type clad layer with respect to the p-side light guide layer, the p-side light guide layer is entirely filled with electrons. Thus, it is enable to prevent an increase of operating voltage by reducing resistance of the p-side light guide layer. Accordingly, even when the thickness of the p-side light guide layer is made to be 0.25 μm or more to increase the slope efficiency, the operating voltage does not increase.

Further, the p-side light guide layer is made of $Al_xGa_{1-x}N$ ($0 \leq x < 1$) and contains no Indium that is an origin of radiative recombination. Thus, it is possible to reduce leakage of electrons and holes that is attributed to the radiative recombination between electrons and holes in the p-side light guide layer, the radiative recombination occurring when electrons are injected into the p-side light guide layer.

On the other hand, when the thickness of the p-side light guide layer is increased to 0.25 μm or more, guided light is attracted toward the p-type clad layer, which possibly causes a problem of generating an increase of internal optical loss due to absorption of free carriers included in the p-type clad layer. In the nitride semiconductor laser element according to the present disclosure, however, since the film thickness do of the n-side light guide layer and the film thickness dp of the p-side light guide layer can satisfy the relationship $dn \geq dp$, and the n-side light guide layer can be as thick as 0.25 μm or more, the increase of internal optical loss caused by the attraction of guided light toward the p-type clad layer can be suppressed.

Though an excessive increase of the thickness of the p-side light guide layer decreases the slope efficiency, the p-side light guide layer having a thickness of 0.6 μm or less has less influence on the decrease of the slope efficiency, so that sufficient slope efficiency can be obtained.

The p-side light guide layer having a carrier concentration of more than $5\times10^{17}$ cm$^{-3}$ increases light absorption. Therefore, by keeping the carrier concentration of the p-side light guide layer at a very small amount of $1\times10^{17}$ cm$^{-3}$ or less, the light absorption can be kept sufficiently small.

Particularly, when the p-side light guide layer is undoped, almost all light absorption due to the absorption of free carriers can be removed. Thus, the light absorption in the p-side light guide layer can be minimized.

According to the present disclosure, there can be provided a nitride semiconductor laser element that suppresses an increase of operating voltage and increases slope efficiency.

DETAILED DESCRIPTION OF EMBODIMENT

Before describing exemplary embodiments of the present disclosure, a problem in a conventional configuration will be described. In a nitride semiconductor laser element as described in WO 2006/109418 A, thickening a p-side guide layer to increase slope efficiency as described in IEEE Journal of Quantum Electronics Vol. 33, no. 12, pp. 2266, 1997 has caused a problem of remarkably increasing operating voltage to increase power consumption, deteriorating laser characteristics.

The present disclosure has been attained in view of the above problem, and the present disclosure provides a nitride semiconductor laser element that suppresses an increase of operating voltage and increases slope efficiency.

Hereinafter, exemplary embodiments of the present disclosure will be described in detail.

First Exemplary Embodiment

Hereinafter, a nitride semiconductor laser element according to a first exemplary embodiment will be described. The present exemplary embodiment will be described using, as an example of the nitride semiconductor laser element, a blue-violet (wavelength 405 nm) semiconductor laser including a hexagonal group III nitride semiconductor. Hereinafter, the present exemplary embodiment will be described with reference to drawings.

Figure 1A:
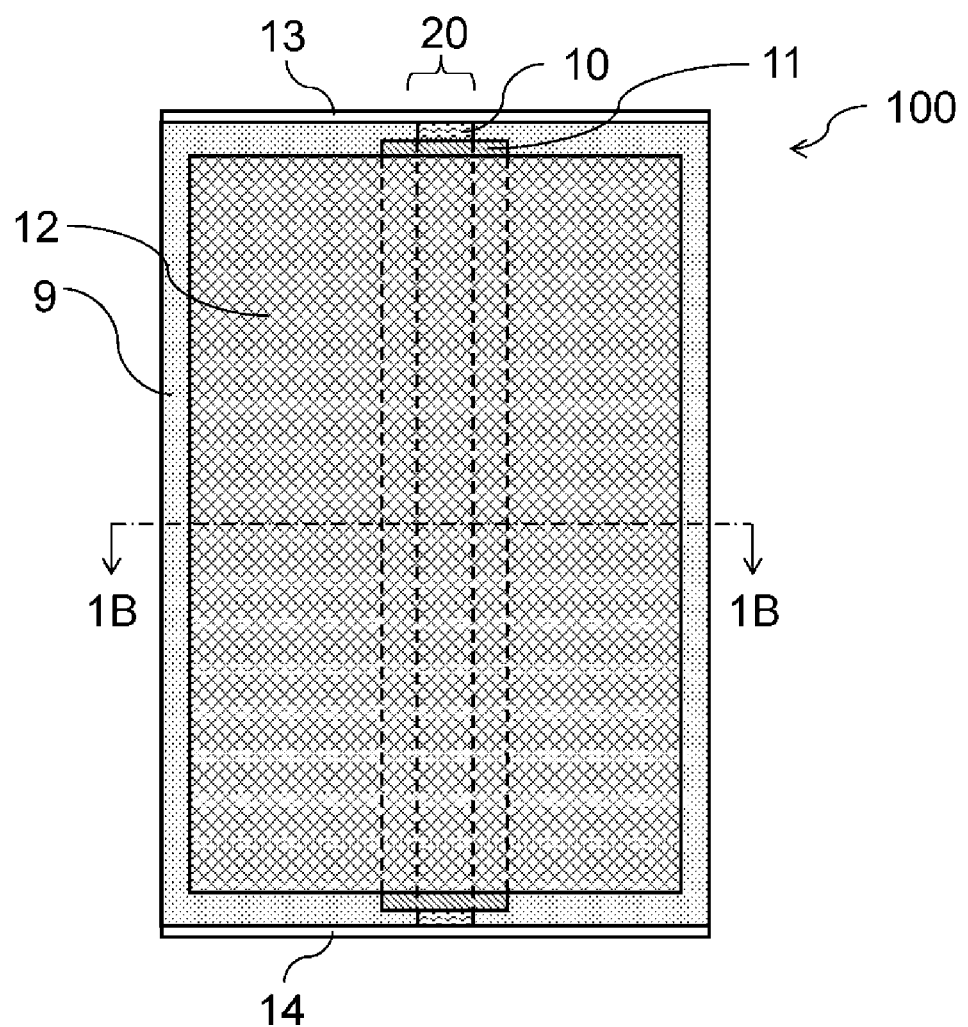
FIG. 1A is a schematic view illustrating an upper surface of a nitride semiconductor laser element according to a first exemplary embodiment of the present disclosure.
Figure 1B:
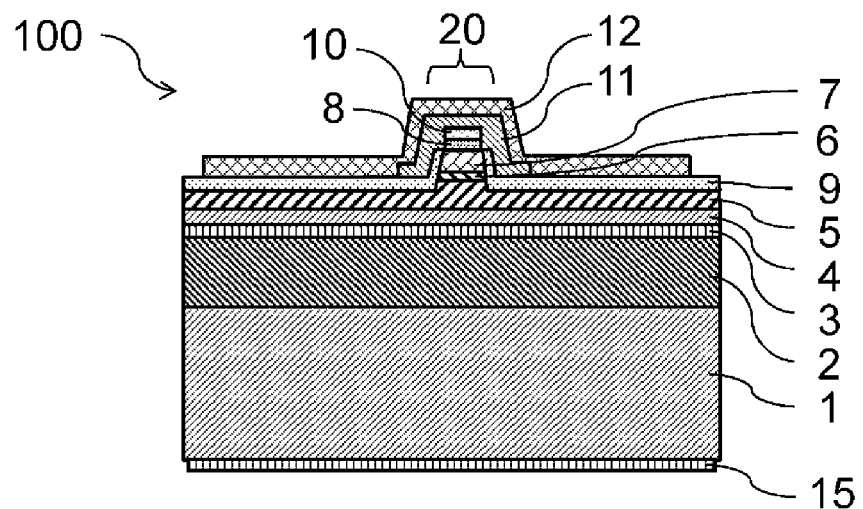
FIG. 1B is a schematic sectional view taken along the line 1B-1B in FIG. 1A illustrating the nitride semiconductor laser element according to the first exemplary embodiment of the present disclosure.

FIGS. 1A and 1B are views each illustrating a configuration of nitride semiconductor laser element 100 according to the present exemplary embodiment. FIG. 1A is a schematic view illustrating an upper surface of the nitride semiconductor laser element that is viewed from above. FIG. 1B is a schematic sectional view obtained by cutting the nitride semiconductor laser element along the line 1B-1B in FIG. 1A and vertically to a paper surface.

First, the configuration of nitride semiconductor laser element 100 will be described.

In FIGS. 1A and 1B, nitride semiconductor laser element 100 includes, on semiconductor substrate 1 that is an n-type hexagonal GaN substrate having a (0001) plane as a main surface, n-type clad layer 2 that is made of $Al_{0.03}GaN$ and has a thickness of 3 µm, n-side light guide layer 3 that is made of undoped i-GaN and has a thickness of 0.5 µm, active layer 4 in which two $In_{0.07}GaN$ layers as well layers and three $In_{0.008}GaN$ layers as barrier layers are stacked to form a multiple quantum well structure, p-side light guide layer 5 made of undoped i-GaN and has a thickness of 0.5 µm, electron barrier layer 6 that is made of p-$Al_{0.35}GaN$ and has a thickness of 0.005 µm, p-type clad layer 7 that has a superlattice of 220 periods each including p-$Al_{0.06}GaN/GaN$ and has a thickness of 0.66 µm, and p-type contact layer 8 made of p-GaN, the layers being stacked in this order. A relationship in bandgap energys among the layers is active layer 4<n-side light guide layer 3=p-side light guide layer 5<n-type clad layer 2=p-type clad layer 7<electron barrier layer 6. Bandgap energy of p-type clad layer 7 having a superlattice structure is based on average composition.

Insulating film 9 made of $SiO_2$ is formed on both sides of optical waveguide 20 of nitride semiconductor laser element 100, and p-type electrode 10 made of Pd/Pt, wiring electrode 11 made of Ti/Pt/Au, and pad electrode 12 made of Ti/Au are formed in a predetermined pattern on an uppermost surface of optical waveguide 20. In lengthwise front and rear positions of optical waveguide 20 of nitride semiconductor laser element 100 are formed rear coat film 14 that is for reflecting light in optical waveguide 20 and is formed of, for example, a dielectric multilayer film and front coat film 13 that is for emitting light and is formed of, for example, a dielectric multilayer film. On a surface opposite from a crystal growth surface of semiconductor substrate 1 is formed n-electrode 15 made of Cu/Au.

Next, a method for manufacturing nitride semiconductor laser element 100 will be described.

First, the layers from n-type clad layer 2 to p-type contact layer 8 are continuously deposited by, for example, a Metalorganic Chemical Vapor Deposition (MOCVD) method on an n-type hexagonal GaN substrate 1 having a (0001) plane as a main surface. Specifically, first, n-type clad layer 2 made of n-type AlGaN is stacked to a thickness of about 3 μm. Here, as a gas raw material for the deposition, there can be used, for example, trimethyl gallium (TMG), trimethyl indium (TMI), and trimethyl aluminum (TMA) for a group III raw material, silane for an n-type impurity, and ammonia for a group V raw material. Si concentration of the n-type AlGaN layer may be set to about $1 \times 10^{18}$ cm$^{-3}$.

Next, i-GaN is grown to 500 nm to form n-side light guide layer 3 that is an i-type layer. Further, active layer 4 is deposited. Hereinafter, a method for stacking active layer 4 will be described below. A quantum well active layer is grown that has 2 periods each including an In$_{0.008}$GaN barrier layer and an In$_{0.07}$GaN quantum well layer. First, a first In$_{0.008}$GaN barrier layer is grown to 30 nm. Next, a first In$_{0.07}$GaN quantum well layer is grown to 7.5 nm. Subsequently, a second In$_{0.008}$GaN barrier layer is grown to 20 nm, followed by growing a second In$_{0.07}$GaN quantum well layer to 7.5 nm. Last, a third In$_{0.008}$GaN barrier layer is grown to 30 nm. Here, the InGaN barrier layer having a large thickness decreases internal quantum efficiency due to radiative recombination in the barrier layer. Thus, each of the barrier layers preferably has a thickness of about 40 nm at a maximum. Next, i-GaN is stacked to a thickness of 500 nm to form p-side light guide layer 5.

Next, p-Al$_{0.35}$GaN (Mg concentration $5 \times 10^{19}$ cm$^{-3}$) is stacked to a thickness of 5 nm to form electron barrier layer 6. The p-AlGaN layer may be formed using, for example, cyclopentadienyl magnesium (Cp$_2$Mg) to have a Mg concentration of $5 \times 10^{19}$ cm$^{-3}$.

Further, a p-Al$_{0.06}$GaN layer (film thickness 1.5 nm, Mg concentration $1 \times 10^{19}$ cm$^{-3}$) and a p-GaN layer (film thickness 1.5 nm, Mg concentration $1 \times 10^{19}$ cm$^{-3}$) are alternately grown for 220 periods to form a total thickness of 660 nm, so that p-type clad layer 7 is stacked that has a superlattice structure. Last, p-GaN (Mg concentration $3 \times 10^{20}$ cm$^{-3}$) is stacked to a thickness of 10 nm to form p-type contact layer 8.

As a crystal growth method for forming a semiconductor stacked body as described above, there can be used, in addition to an MOCVD method, a Molecular Beam Epitaxy (MBE) method, a Chemical Beam Epitaxy (CBE) method, and the like that are growth methods capable of growing a GaN blue-violet semiconductor laser structure.

Next, the grown wafer is processed into a ridge stripe laser element.

First, a SiO$_2$ insulating film that has a film thickness of 0.3 μm and is made of SiO$_2$ is deposited on p-type contact layer 8 by, for example, a thermal CVD method. Further, the SiO$_2$ insulating film is formed into stripes having a width of 8 μm by etching the regions other than the stripes through a photolithography method and an etching method with use of hydrofluoric acid. In this process, a direction of the stripes is to be parallel with an m-axis direction of hexagonal GaN in view of forming an end surface of the laser element using a natural cleavage plane (m-plane) of a hexagonal nitride semiconductor.

Next, an upper portion of the stacked structure body is etched at a depth of 1.0 μm from an upper surface of the stacked structure body by an Inductively Coupled Plasma (ICP) etching method and with use of the SiO$_2$ insulating film to form a ridge stripe portion that includes p-type contact layer 8 and p-type clad layer 7 and constitutes optical waveguide 20. As described above, the semiconductor stacked body includes p-type contact layer 8 having a thickness of 10 nm, p-type clad layer 7 having a thickness of 660 nm, electron barrier layer 6 having a thickness of 5 nm, and p-side light guide layer 5 having a thickness of 500 nm, the layers of which are stacked in this order downward from an upper surface of the semiconductor stacked body. Thus, the semiconductor stacked body is etched at a depth of 1.0 μm (1000 nm) from the upper surface of the semiconductor stacked body to allow p-side light guide layer 5 to be etched halfway. That is, as shown in FIG. 1B, p-side light guide layer 5 includes a stripe-shaped protrusion extending in parallel with an upper surface of p-side light guide layer 5, and a flat portion disposed on both sides of the protrusion. In other words, the ridge stripe portion includes the protrusion of p-side light guide layer 5, electron barrier layer 6 provided on the protrusion, p-type clad layer 7 provided on electron barrier layer 6, and p-type contact layer 8 provided on p-type clad layer 7. Here, electron barrier layer 6, p-type clad layer 7, and p-type contact layer 8 that are provided on the protrusion of p-side light guide layer 5 have, in a plan view, almost the identical stripe shape with the stripe shape of an upper surface of the protrusion of p-side light guide layer 5. When direct contact of p-type clad layer 7 with p-type electrode 10 can give sufficient electric connection, p-type contact layer 8 is not necessarily provided.

Then, the SiO$_2$ insulating film is removed with use of hydrofluoric acid, and insulating film 9 that has a film thickness of 200 nm and is made of SiO$_2$ is formed again over the upper surface of the semiconductor stacked body including an upper surface and a side surface of the ridge stripe portion by a thermal CVD method.

Next, on insulating film 9 is, by a lithography method, formed a resist pattern including a 7.5-μm-wise opening that is on a top surface of the ridge stripe portion (optical waveguide 20) and is along a direction in which the ridge stripe portion extends. Subsequently, insulating film 9 is etched by Reactive Ion Etching (RIE) with use of, for example, methane trifluoride (CHF$_3$), with the resist pattern as a mask, to expose from insulating film 9 p-type contact layer 8 provided as the upper surface of the ridge stripe portion.

Next, a metal stacked film for forming p-electrode 10 made of, for example, 40-nm-thick palladium (Pd) and 35-nm-thick platinum (Pt) is formed on at least p-type contact layer 8 exposed on the upper surface of the ridge stripe portion by, for example, an Electron Beam (EB) evaporation method. Then, the metal stacked film is removed in the region except the top surface of the ridge stripe portion by a lift-off method for removing a resist pattern to form p-electrode 10.

Next, wiring electrode 11 is formed on insulating film 9 by a lithography method and a lift-off method. Wiring electrode 11 covers p-electrode 10 on the ridge stripe portion, has a dimension of, for example, 750 μm for a plane in parallel with the direction in which the ridge stripe portion extends, has a dimension of, for example, 150 μm for a plane orthogonal to the direction in which the ridge stripe portion extends, and is made of titanium (Ti)/platinum (Pt)/gold (Au). Here, wiring electrode 11 is a metal stacked film of Ti/Pt/Au having thicknesses of 50 nm, 200 nm, and 100 nm, respectively. Generally, a plurality of semiconductor laser elements are formed in lines on a main surface of a wafer at the time of production. Therefore, when the wafer, or the substrate is divided into individual laser chips, cutting of wiring electrode 11 may possibly peel p-electrode 10 closely attached to wiring electrode 11 from p-type contact layer 8. For this reason, it is desirable that wiring electrode 11 be not connected between semiconductor laser elements adjacent to each other.

Subsequently, an Au layer having a thickness of, for example, 10 μm is formed over wiring electrode 11 by an electrolytic plating method to form pad electrode 12. Such formation enables mounting of a laser chip by wire bonding as well as effective dissipation of heat generated in active layer 4 to improve reliability of nitride semiconductor laser element 100. When direct contact of pad electrode 12 with p-type electrode 10 can give sufficient electric connection, wiring electrode 11 is not necessarily provided.

Next, a rear surface of the wafer is polished by a diamond slurry to thin semiconductor substrate 1 to a thickness of about 100 μm, on the wafer being disposed nitride semiconductor laser element 100 in which the Au pad electrode has been formed. Then, a metal stacked film including, for example, Ti having a thickness of 5 nm, Pt having a thickness of 10 nm, and Au having a thickness of 1000 nm is formed by, for example, an EB evaporation method on the rear surface (the surface opposite from the surface on which optical waveguide 20 is formed) of semiconductor substrate 1, to form n-electrode 15.

Next, nitride semiconductor laser element 100 on the wafer is cleaved along the m-plane (primary cleavage) so that the length along the m-axis direction becomes, for example, 800 μm. Subsequently, front coat film 13 is formed on a cleavage plane from which laser light is output and rear coat film 14 is formed on the other cleavage plane by, for example, an electron cyclotron resonance (ECR) sputtering method. Here, as a material for front coat film 13, a dielectric film such as a $SiO_2$ single layer film is used, for example. As a material for rear coat film 14, a dielectric film such as a $ZrO_2/SiO_2$ stacked film is used, for example. Nitride semiconductor laser element 100 can be made to have a reflectivity of, for example, 6% on a front side (light output side) and a reflectivity of, for example, 95% on a rear side (the side opposite from the light output side) to configure nitride semiconductor laser element 100 having high efficiency.

Subsequently, nitride semiconductor laser element 100 that has undergone the primary cleavage is cleaved along an a-plane (secondary cleavage) between optical waveguides 20 formed at a pitch of, for example, 200 μm as the length along the a-axis direction, to complete the nitride semiconductor laser element according to the first exemplary embodiment.

Figure 2A:
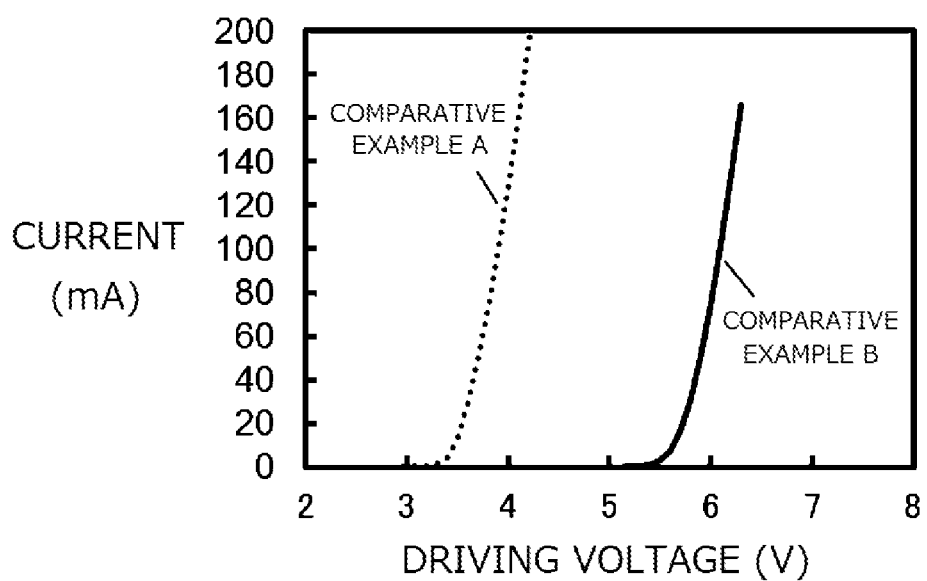
FIG. 2A is a graph showing a change of a current flowing in each of nitride semiconductor laser elements according to Comparative Examples A and B, with respect to driving voltage.

Next, the nitride semiconductor laser element according to the first exemplary embodiment and nitride semiconductor laser elements according to Comparative Examples A and B were evaluated for operating voltage, in order to demonstrate that an increase of operating voltage is suppressed in the nitride semiconductor laser element according to the present disclosure in spite of increasing the thickness of p-side light guide layer 5. In contrast to the nitride semiconductor laser element according to the first exemplary embodiment, the nitride semiconductor laser elements according to Comparative Examples A and B each include electron barrier layer 6 between active layer 4 and p-side light guide layer 5. In the nitride semiconductor laser element according to Comparative Example A, n-side light guide layer 3 and p-side light guide layer 5 are made of $In_{0.005}GaN$ and have a thickness of 0.1 μm. Etching for forming a ridge stripe portion is performed at an etching depth of 0.6 μm, so that p-type clad layer 7 is etched halfway. Thus, the ridge stripe portion includes a protrusion of p-type clad layer 7 and p-type contact layer 8 formed on an upper surface of the protrusion. On the other hand, in the nitride semiconductor laser element according to Comparative Example B, n-side light guide layer 3 and p-side light guide layer 5 have a thickness of 0.5 μm that is the same as in the nitride semiconductor laser element according to the first exemplary embodiment, and the depth of etching for forming a ridge stripe portion is 1 μm that is also the same as in the nitride semiconductor laser element according to the first exemplary embodiment. The other configuration of the nitride semiconductor laser elements according to Comparative Examples A and B is the same as in the nitride semiconductor laser element according to the first exemplary embodiment. FIG. 2A shows results of calculating a relationship between driving voltage and a current in the nitride semiconductor laser elements according to Comparative Examples A and B. These results demonstrate a problem that in the nitride semiconductor laser elements according to Comparative Examples A and B, which include electron barrier layer 6 between active layer 4 and p-side light guide layer 5, the driving voltage, i.e., operating voltage increases when the thickness of the p-side light guide layer from 0.1 μm (Comparative Example A) to 0.5 μm (Comparative Example B) increases.

Figure 2B:
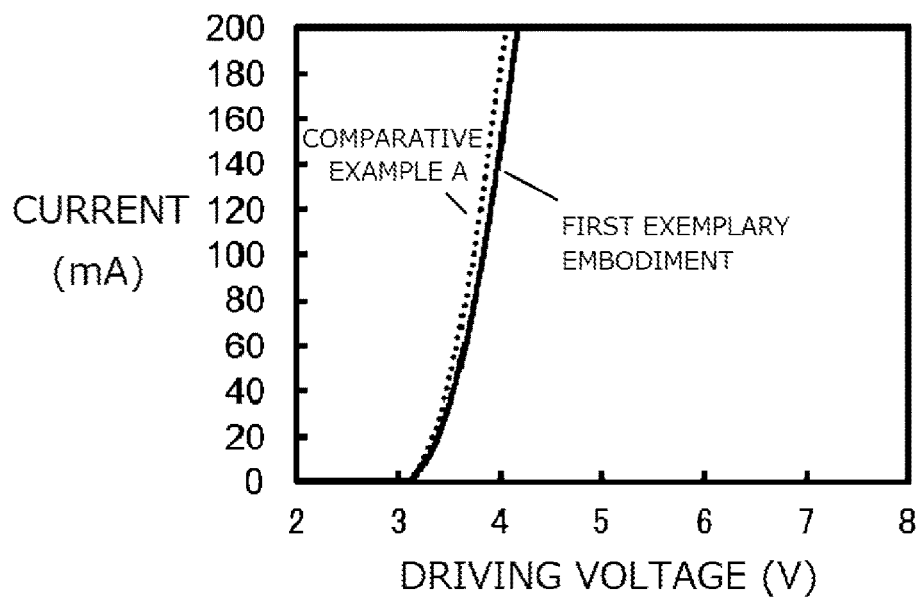
FIG. 2B is a graph showing a change of a current flowing in each of the nitride semiconductor laser elements according to the first exemplary embodiment and Comparative Example A, with respect to driving voltage.

On the other hand, the nitride semiconductor laser elements according to the first exemplary embodiment and Comparative Example A were prepared and checked, by an experiment, for a relationship between driving voltage and a current flowing in each of the nitride semiconductor laser elements. FIG. 2B shows results of the experiment. FIG. 2B shows the experimental results demonstrating that the nitride semiconductor laser element according to the first exemplary embodiment in which electron barrier layer 6 is provided between p-side light guide layer 5 and p-type clad layer 7 hardly increases the driving voltage even when having an increased thickness of p-side light guide layer 5 of 0.5 μm, in comparison with the nitride semiconductor laser element according to Comparative Example A that has a thickness of p-side light guide layer 5 of 0.1 μm.

Figure 3:
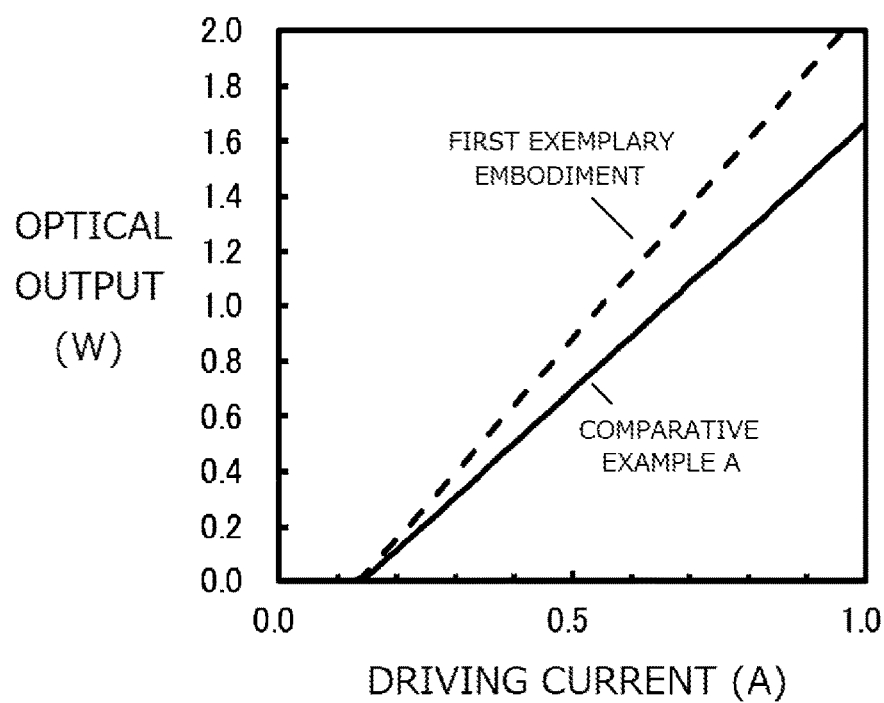
FIG. 3 is a graph showing a change of optical output with respect to a driving current in each of the nitride semiconductor laser elements according to the first exemplary embodiment and Comparative Example A.

FIG. 3 shows results of calculating optical output according to changes of a driving current in the nitride semiconductor laser elements according to the first exemplary embodiment and Comparative Example A. As understood from FIG. 3, the optical output is increased by making p-side light guide layer 5 have composition containing no Indium and by increasing the thickness of p-side light guide layer 5 from 0.1 μm to 0.5 μm. This calculation is performed by applying a refractive index, an extinction coefficient, and a radiative recombination rate described in Handbook of Nitride Semiconductors and Devices, Volume 1, Materials Properties, Physics and Growth, Hadis Morkoc, Wiley, to an equation described in Second Chapter of Diode Lasers and Photonic Integrated Circuits (Wiley Series in Microwave and Optical Engineering) to acquire an oscillation threshold current and slope efficiency.

Figure 4:
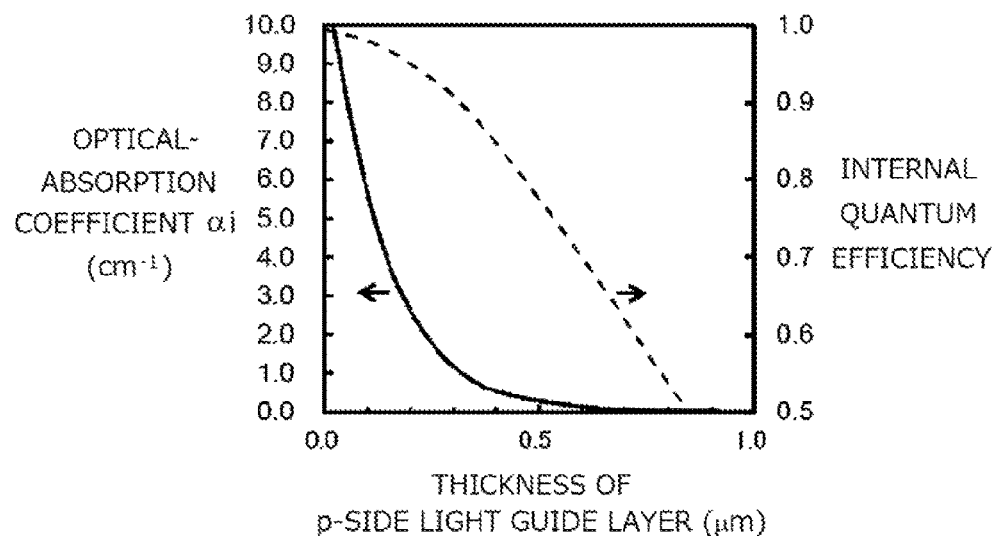
FIG. 4 is a graph showing a change of each of an optical-absorption coefficient and internal quantum efficiency with respect to thickness of a p-side light guide layer in the nitride semiconductor laser element according to the first exemplary embodiment.

FIG. 4 shows results of calculating an optical-absorption coefficient and internal quantum efficiency according to changes of the thickness of p-side light guide layer 5 in the nitride semiconductor laser element according to the first exemplary embodiment. The calculation is performed using the refractive index, the extinction coefficient, and the radiative recombination rate described in Handbook of Nitride Semiconductors and Devices, Volume 1, Materials Properties, Physics and Growth, Hadis Morkoc, Wiley. As understood from FIG. 4, increasing the thickness of p-side light guide layer 5 decreases the optical-absorption coefficient. This is because guided light distributed along a stacking direction travels through an i-layer that has less light absorption. On the other hand, increasing the thickness of p-side light guide layer 5 decreases the internal quantum efficiency. This is because radiative recombination in p-side light guide layer 5 increases along with the increase in thickness of p-side light guide layer 5, and the radiative recombination cannot be eliminated while being more moderate than in cases of using a p-side light guide layer made of InGaN.

Figure 5:
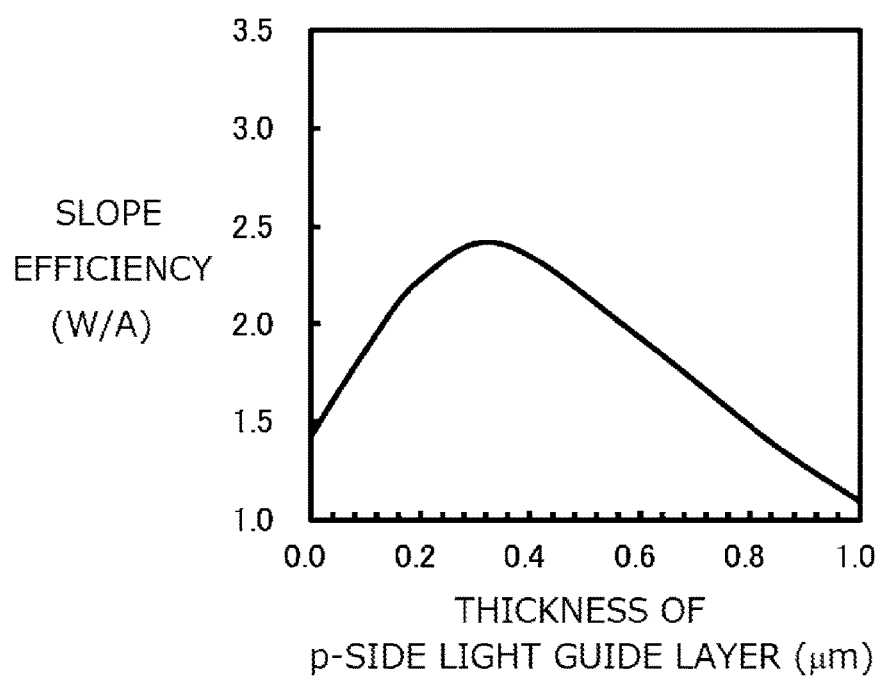
FIG. 5 is a graph showing a change of slope efficiency with respect to the thickness of the p-side light guide layer in the nitride semiconductor laser element according to the first exemplary embodiment.

FIG. 5 shows a result of calculating slope efficiency of the nitride semiconductor laser element of the first exemplary embodiment according to the following equation (1).

$$SE = (h^*v/q) \times \eta_i \times \alpha_m/(\alpha_i + \alpha_m) \quad (1)$$

Here, h represents a Planck's constant, v represents a frequency of laser light, q represents elementary charge, and $\alpha_m$ represents mirror loss. The mirror loss $\alpha_m$ represents light lost by an emission from the inside to the outside of a resonator and expressed by the following equation (2).

$$\alpha_m = 1/(2 \times L) \times \{1/ln(R_f \times R_r)\} \quad (2)$$

As understood from FIG. 5, since the optical loss decreases along with the increase in thickness of p-side light guide layer 5, the slope efficiency increases. However, the slope efficiency contrariwise decreases when p-side light guide layer 5 has a thickness of more than 0.3 μm with the slope efficiency being a peak at a thickness of 0.3 μm of p-side light guide layer 5. This is because a decrease in internal quantum efficiency due to radiative recombination cannot be ignored in p-side light guide layer 5 that is excessively thick. A slope efficiency of a laser of 2 W/A or more is preferable for a highly efficient light source such as lighting. Thus, p-side light guide layer 5 preferably has a thickness of 0.25 μm or more, more preferably has a thickness of 0.30 μm or more. It is necessary to be careful to contain, in p-side light guide layer 5, as little Indium as possible that is an origin of the radiative recombination, when p-side light guide layer 5 is formed. In formation of a stacked structure, even when supply of an Indium raw material is stopped due to a reason of switching raw materials, a small amount of Indium is sometimes mixed in. Therefore, it is significant to be careful not to allow Indium to be mixed in by interrupting the growth at an appropriate time. According to a study by the present inventors, in cases where a slight amount of Indium is unavoidably mixed in, an Indium composition of more than 0.5% rapidly increases the radiative recombination, causing a decrease in internal quantum efficiency. Thus, even when Indium is mixed in, the decrease in internal quantum efficiency can be suppressed by keeping the Indium composition at 0.5% or less. In the meantime, p-side light guide layer 5 may be p-type doped. In this case, so-called absorption of free carriers that is light absorption generated in a p-type doped layer needs to be considered when doping concentration is high. A carrier concentration of more than $5 \times 10^{17}$ cm$^{-3}$ particularly increases light absorption. Thus, it is preferable to keep, for maintenance of sufficiently small light absorption, a very small amount of dope to give a carrier concentration of $1 \times 10^{17}$ cm$^{-3}$ or less.

In the first exemplary embodiment, description has been made for the nitride semiconductor laser element having a light emission wavelength in a blue-violet region. A superluminescent diode, however, may also be prepared that has a wider light emission spectrum attained by reducing the reflectivity on the front side, is reduced in speckle noise, and has a light emission wavelength in a blue-violet region. Further, a blue semiconductor laser or a blue superluminescent diode may also be prepared that is obtained by increasing the Indium composition of the active layer to about 16% to make the wavelength a blue wavelength having a wavelength of 445 nm.

Second Exemplary Embodiment

Hereinafter, a nitride semiconductor laser element according to a second exemplary embodiment will be described. The nitride semiconductor laser element according to the present exemplary embodiment is identical with nitride semiconductor laser element 100 according to the first exemplary embodiment except for changing the material of p-side light guide layer 5 to $Al_{0.01}Ga_{0.99}N$ containing 1% of Al. And a manufacturing method of the nitride semiconductor laser element according to the present exemplary embodiment is also identical with that of nitride semiconductor laser element 100 according to the first exemplary embodiment except for changing p-side light guide layer 5 from GaN to AlGaN. Therefore, a structure drawing for describing the present exemplary embodiment is omitted.

A step of preparing the nitride semiconductor laser element according to the second exemplary embodiment is made by changing the material for p-side light guide layer 5 in the step of preparing the nitride semiconductor laser element according to the first exemplary embodiment. That is, AlGaN is grown in place of GaN in the step of preparing the nitride semiconductor laser element according to the first exemplary embodiment. Use of AlGaN for p-side light guide layer 5 can further increase the internal quantum efficiency because AlGaN has lower light emission efficiency than GaN.

Figure 6:
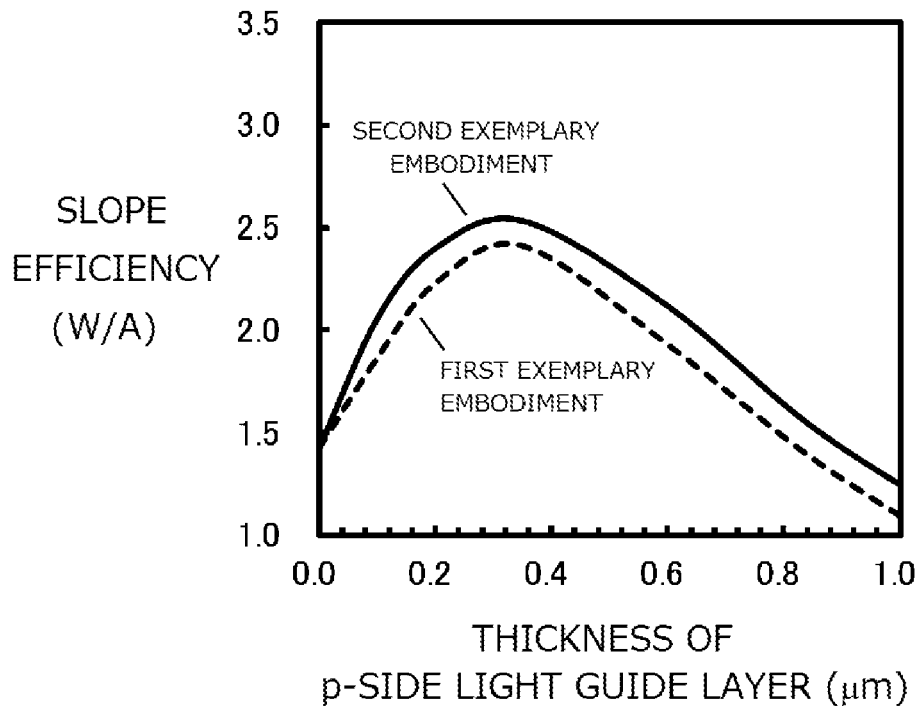
FIG. 6 is a graph showing a change of slope efficiency with respect to the thickness of the p-side light guide layer in each of the nitride semiconductor laser elements according to the first and second exemplary embodiments.
Figure 7:
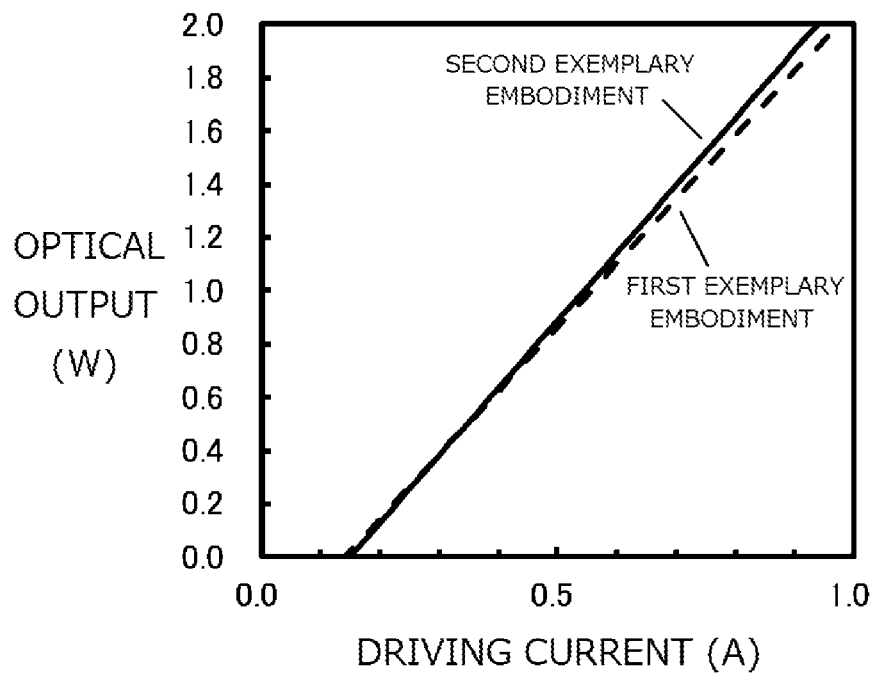
FIG. 7 is a graph showing a change of optical output with respect to a driving current in each of the nitride semiconductor laser elements according to the first and second exemplary embodiments.

FIG. 6 shows a result of calculating slope efficiency of the nitride semiconductor laser element according to the second exemplary embodiment in the same manner as in FIG. 5. FIG. 6 also shows by the dashed line the result of the first exemplary embodiment shown in FIG. 5. As understood from FIG. 6, the slope efficiency of the nitride semiconductor laser element according to the second exemplary embodiment shows the same tendency as the slope efficiency in the first exemplary embodiment. However, the nitride semiconductor laser element according to the second exemplary embodiment that includes p-side light guide layer 5 containing Al has higher slope efficiency than the nitride semiconductor laser element according to the first exemplary embodiment. FIG. 7 shows results of calculating optical output according to changes of a driving current in the nitride semiconductor laser elements according to the first and second exemplary embodiments. As understood from FIG. 7, the nitride semiconductor laser element according to the second exemplary embodiment that includes the p-side light guide layer containing Al has higher optical output than the nitride semiconductor laser element according to the first exemplary embodiment when the driving current is high. This is because the nitride semiconductor laser element according to the second exemplary embodiment has, as shown in FIG. 6, higher slope efficiency than the nitride semiconductor laser element according to the first exemplary embodiment.

In the second exemplary embodiment, it is preferable to make the Al composition of the p-side light guide layer smaller than the Al composition of the p-type clad layer and to keep the Al composition of the p-side light guide layer at 2% or less, more preferably 1% or less. This is because high Al composition decreases a confinement factor of guided light along the stacking direction, causing an increase in oscillation threshold.

Third Exemplary Embodiment

Figure 8A:
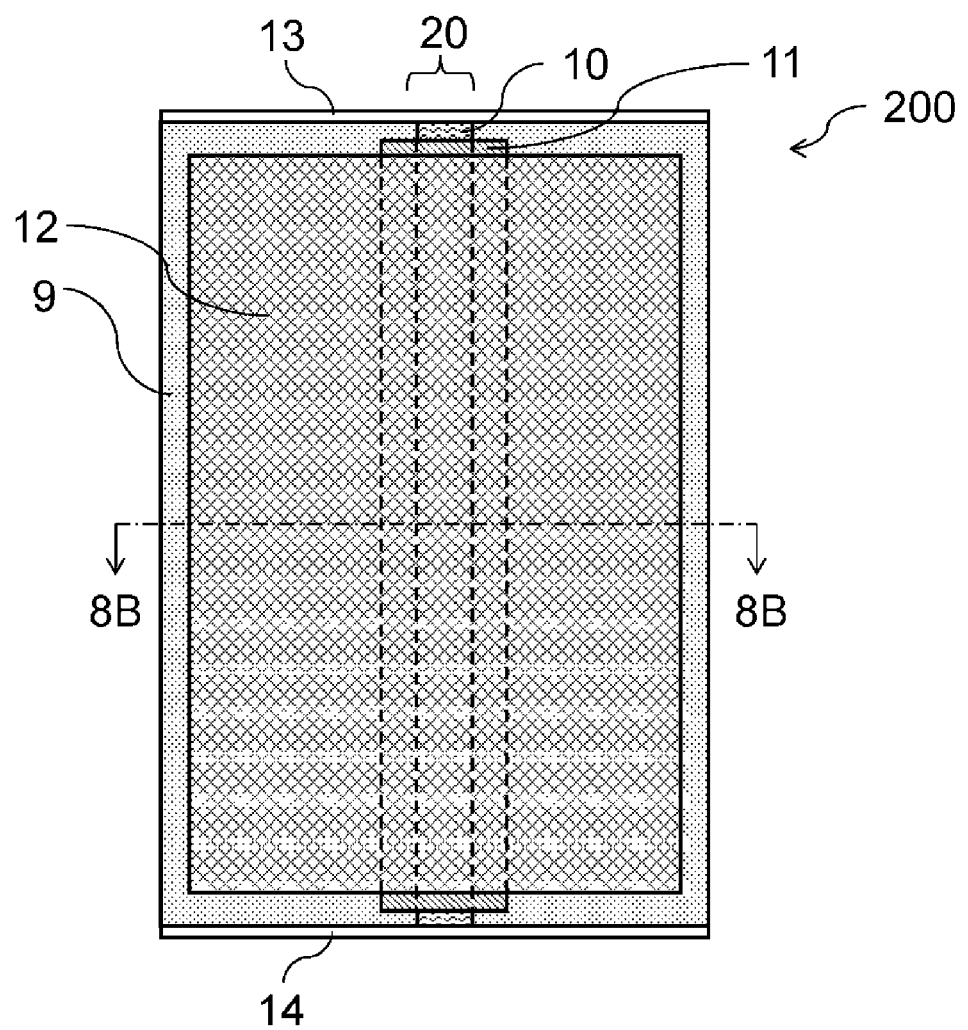
FIG. 8A is a schematic view illustrating an upper surface of a nitride semiconductor laser element according to a third exemplary embodiment of the present disclosure.
Figure 8B:
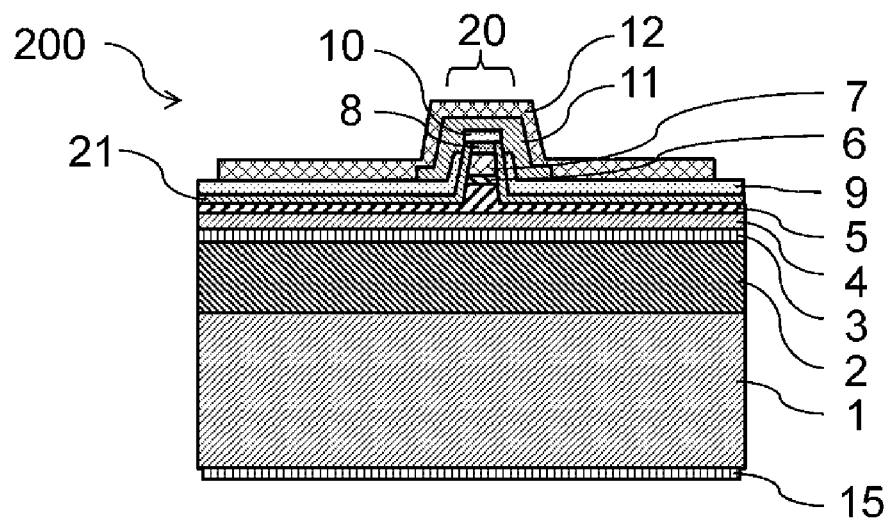
FIG. 8B is a schematic sectional view taken along the line 8B-8B in FIG. 8A illustrating the nitride semiconductor laser element according to the third exemplary embodiment of the present disclosure.

Hereinafter, a nitride semiconductor laser element according to a third exemplary embodiment will be described. FIG. 8A is a schematic view illustrating an upper surface of nitride semiconductor laser element 200 according to the present exemplary embodiment that is viewed from above. FIG. 8B is a schematic sectional view obtained by cutting nitride semiconductor laser element 200 along the line 8B-8B in FIG. 8A and vertically to a paper surface. In nitride semiconductor laser element 200 according to the present exemplary embodiment, high resistance region 21 is formed on a side surface of a ridge stripe portion and on an upper surface of an etched region (flat portion) on both sides of the ridge stripe portion. High resistance region 21 has a higher resistance value than a resistance value inside the ridge stripe portion or a resistance value in a region under high resistance region 21 on the flat portion on both sides of the ridge stripe portion. Nitride semiconductor laser element 200 according to the present exemplary embodiment is different from nitride semiconductor laser element 100 according to the first exemplary embodiment in the point described above, and is the same as nitride semiconductor laser element 100 according to the first exemplary embodiment in terms of the other configuration.

Meaning of forming high resistance region 21 is as follows. In a step of etching for forming the ridge stripe portion in nitride semiconductor laser element 100 according to the first exemplary embodiment, a damage region is formed on a surface of the etched region in the semiconductor stacked body. This damage region includes many defects functioning as electron traps to generate current leakage, decreasing optical output under a constant driving current. Further, the current leakage causes heat generation to expand the damage region and increase a defect in the damage region. As a result, the current leakage is further increased to decrease optical output, falling in a vicious cycle. Therefore, high resistance of the damage region on the surface of the etched region in the semiconductor stacked body can reduce electrons captured by electron traps to decrease a leak current. As a result, the decrease in optical output can be suppressed to improve reliability of the nitride semiconductor laser element.

In nitride semiconductor laser element 200 according to the present exemplary embodiment, the ridge stripe portion includes, in the same manner as in nitride semiconductor laser element 100 according to the first exemplary embodiment, a protrusion of p-side light guide layer 5, electron barrier layer 6 provided on the protrusion, p-type clad layer 7 provided on electron barrier layer 6, and p-type contact layer 8 provided on p-type clad layer 7. Here, on the side surface of the ridge stripe portion, at least electron barrier layer 6 preferably includes high resistance region 21. The current leakage of electron barrier layer 6 is suppressed near the side surface of the ridge stripe portion to suppress deviation of a carrier distribution in active layer 4. This effect can suppress local deterioration due to carrier concentration to improve reliability of the nitride semiconductor laser element.

A method for manufacturing the nitride semiconductor laser element according to the present exemplary embodiment will be described below. The steps are the same as in the first exemplary embodiment until the step of forming a stacked structure on a substrate and forming a ridge stripe portion by etching. Next, a side surface of the ridge stripe portion and a surface of a flat portion on both sides of the ridge stripe portion are selectively made to be a high resistance.

As a technical example of making high resistance, there can be exemplified Fe (iron) ion injection selectively performed on the side surface of the ridge stripe portion and the surface of the flat portion on both sides of the ridge stripe portion. Here, a peak ion concentration in an injection area preferably ranges from $1\times10^{17}$ cm$^{-3}$ to $1\times10^{19}$ cm$^{-3}$, inclusive. High resistance region 21 formed through the ion injection preferably has a thickness of 10 nm or more. The type of an ion injected may be a material other than Fe as long as the material can attain high resistance of a semiconductor layer. Examples of such a material include Ar (argon), N (nitrogen), F (fluorine), and B (boron). As described above, high resistance region 21 that includes, in addition to a nitride semiconductor constituting the semiconductor stacked body, at least one element from among Fe, Ar, N, F, and B is formed.

As another technique of making high resistance, there can be exemplified selective oxidation of the side surface of the ridge stripe portion and the surface of the flat portion on both sides of the ridge stripe portion. As a method for selective oxidation, there can be used steam oxidation of heating a nitride semiconductor to a temperature of as high as 800° C. or more in a steam atmosphere, and a technique of heating, in the same manner, a nitride semiconductor to as high as 800° C. or more, in an atmosphere containing oxygen. Alternatively, there can also be used a technique of heating, in the same manner, a nitride semiconductor to as high as 800° C. or more, in an atmosphere containing nitrogen to selectively nitride the nitride semiconductor for high resistance. As described above, high resistance region 21 that includes an oxide or a nitride of the nitride semiconductor constituting the semiconductor stacked body is formed.

High resistance region 21 is not limited to those formed by means of making high resistance, such as ion injection and selective oxidation, but may be formed by depositing a material having a high resistance value. High resistance region 21 is formed on the side surface of the ridge stripe portion and the upper surface of the flat portion on both sides of the ridge stripe portion. High resistance region 21, however, may be formed only on the side surface of the ridge stripe portion.

After the step of making high resistance for the side surface of the ridge stripe portion and the upper surface of the flat portion on both sides of the ridge stripe portion, nitride semiconductor laser element 200 according to the present exemplary embodiment is completed using the same method as in the first exemplary embodiment.

Figure 9:
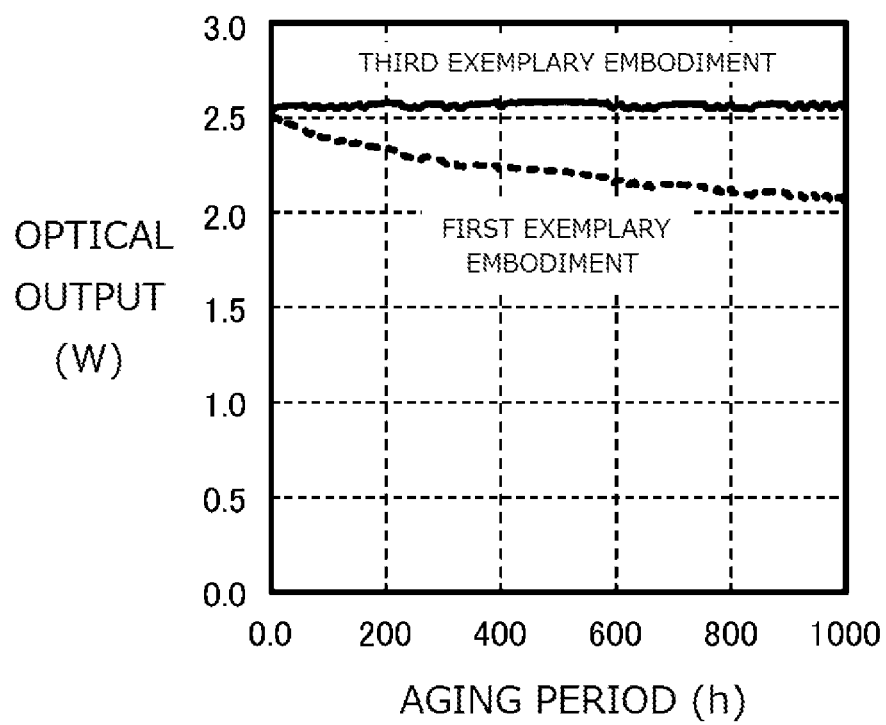
FIG. 9 is a graph showing a change of optical output with respect to an aging period in each of the nitride semiconductor laser elements according to the first and third exemplary embodiments.

FIG. 9 shows a result of a reliability test for nitride semiconductor laser element 200 prepared in the third exemplary embodiment together with a result of nitride semiconductor laser element 100 prepared in the first exemplary embodiment. In FIG. 9, the x-axis represents an aging period, and the y-axis represents optical output. Conditions of the reliability test is an initial optical output of 2.5 W and an element mounting package temperature of 25° C. FIG. 9 shows by the solid line a change of optical output with respect to an aging period in nitride semiconductor laser element 200 according to the third exemplary embodiment and by the dashed line, in nitride semiconductor laser element 100 according to the first exemplary embodiment. As shown in FIG. 9, nitride semiconductor laser element 100 according to the first exemplary embodiment shows a decrease of about 0.5 W for 1000 hours in optical output. Nitride semiconductor laser element 200 according to the third exemplary embodiment, however, hardly shows a decrease in optical output even after a lapse of 1000 hours. Thus, by providing high resistance region 21, a decrease in optical output during long period operation can be suppressed and reliability of the nitride semiconductor laser element can be improved.

The nitride semiconductor laser element according to the present disclosure can be used for, for example, a laser display, a liquid crystal backlight, a headlight for vehicles, a laser knife for surgical operations, and welding purposes, and is useful.

What is claimed is:

1. A nitride semiconductor laser element comprising:
   an n-type clad layer made of a nitride semiconductor;
   a p-type clad layer made of a nitride semiconductor;
   an active layer provided between the n-type clad layer and the p-type clad layer;
   an n-side light guide layer that is provided between the n-type clad layer and the active layer and is made of a nitride semiconductor having a bandgap energy smaller than that of the n-type clad layer but larger than that of the active layer.
   a p-side light guide layer that is provided between the p-type clad layer and the active layer and is made of a nitride semiconductor having a bandgap energy smaller than that of the p-type clad layer but larger than that of the active layer; and
   an electron barrier layer that is provided between the p-side light guide layer and the p-type clad layer and is made of a nitride semiconductor having a bandgap energy larger than that of the p-type clad layer, wherein:
   the p-side light guide layer is made of $Al_xGa_{1-x}N$ containing no Indium, where $0 \leq x < 1$, and
   a film thickness dn of the n-side light guide layer and a film thickness dp of the p-side light guide layer satisfy relationships $dp \geq 0.25$ μm and $dn \geq dp$.

2. The nitride semiconductor laser element according to claim 1, wherein the film thickness dp of the p-side light guide layer is 0.25 μm $dp \leq 0.6$ μm.

3. The nitride semiconductor laser element according to claim 1, wherein the p-side light guide layer has an impurity addition concentration of $1 \times 10^{17}$ cm$^{-3}$ or less.

4. The nitride semiconductor laser element according to claim 1, wherein the p-side light guide layer is an undoped layer.

5. The nitride semiconductor laser element according to claim 1, wherein the p-side light guide layer includes a stripe-shaped protrusion extending in parallel with an upper surface of the p-side light guide layer, and a flat portion disposed on both sides of the protrusion.

6. The nitride semiconductor laser element according to claim 5, comprising a ridge stripe portion that includes the protrusion of the p-side light guide layer, the electron barrier layer provided on the protrusion, and the p-type clad layer provided on the electron barrier layer.

7. The nitride semiconductor laser element according to claim 6, wherein the electron barrier layer includes, on a side surface of the ridge stripe portion, a high resistance region having a higher resistance value than a resistance value inside the ridge stripe portion.

8. The nitride semiconductor laser element according to claim 6, wherein a high resistance region having a higher resistance value than a resistance value inside the ridge stripe portion is formed on a side surface of the ridge stripe portion.

9. The nitride semiconductor laser element according to claim 6, wherein a high resistance region having a higher resistance value than a resistance value inside the ridge stripe portion is formed on both a side surface of the ridge stripe portion and an upper surface of the flat portion.

10. The nitride semiconductor laser element according to claim 7, wherein the high resistance region includes, in addition to a nitride semiconductor constituting the nitride semiconductor laser element, at least one element selected from a group consisting Fe (iron), Ar (argon), N (nitrogen), F (fluorine), and B (boron).

11. The nitride semiconductor laser element according to claim 7, wherein the high resistance region includes an oxide or a nitride of a nitride semiconductor constituting the nitride semiconductor laser element.

\* \* \* \* \*